United States Patent [19]
Li et al.

[11] Patent Number: 5,774,801
[45] Date of Patent: Jun. 30, 1998

[54] HIGH DYNAMIC RANGE MIXER HAVING LOW CONVERSION LOSS, LOW LOCAL OSCILLATOR INPUT POWER, AND HIGH DYNAMIC RANGE AND A METHOD FOR DESIGNING THE SAME

[75] Inventors: Leo L. Li; Ellis Glazebrook, both of Lynchburg, Va.

[73] Assignee: Ericsson Inc., Research Triangle Park, N.C.

[21] Appl. No.: 518,501

[22] Filed: Aug. 23, 1995

[51] Int. Cl.$^6$ .................................................... H04B 1/26
[52] U.S. Cl. ........................ 455/326; 455/318; 455/333; 333/25
[58] Field of Search ................................. 455/327, 318, 455/319, 323, 326, 333; 333/25, 26

[56] References Cited

U.S. PATENT DOCUMENTS

| | | | |
|---|---|---|---|
| 4,063,176 | 12/1977 | Milligan et al. . | |
| 4,125,810 | 11/1978 | Pavio . | |
| 4,293,956 | 10/1981 | Altstatt | 455/327 |
| 4,306,311 | 12/1981 | Igarashi | 455/327 |
| 4,330,868 | 5/1982 | Hallford | 455/327 |
| 4,430,758 | 2/1984 | Snyder | 433/227 |
| 4,755,775 | 7/1988 | Marczewski et al. | 333/26 |
| 4,823,400 | 4/1989 | Dobrovocny | 455/326 |
| 5,428,838 | 6/1995 | Chang et al. | 455/326 |
| 5,517,683 | 5/1996 | Niehenke et al. | 455/323 |

OTHER PUBLICATIONS

*Microwave Journal*, vol. 37, No. 2, 1 Feb. 1994, pp. 90, 92–94, 96/97, XP000434617, Masataka Osawa et al., "A superminiaturized double–balanced SMT mixer–modulator".

*WESCON Conference Record*, vol. 25, No. 24/3, 1 Sep. 1981, El Segundo, US, pp. 1–13, XP002017762, P. Will, "Termination Insensitive Mixers".

*WESCON Technical Papers*, vol. 18, No. 3/6 1974, North Hollywood, US, pp. 1–11, XP002017763, F.A. Marki, "Broad–Band Microwave Mixers Incorporate Balanced–Line Hybrids".

*Primary Examiner*—Edward F. Urban
*Attorney, Agent, or Firm*—Nixon & Vanderhye P.C.

[57] ABSTRACT

A double-double-balanced mixer includes first and second radio frequency baluns and first and second local oscillator baluns formed on a dielectric substrate and connected to two diode rings. An intermediate frequency port is also connected to two diode rings. The particular dimensions of the stripline mixer are carefully selected to provide high dynamic range, strong suppression of intermodulation products, low conversion loss, and low local oscillator input power. The specific design dimensions of the mixer are selected contrary to conventional mixer design principle. For example, the local oscillator and radio frequency balun microstrips are designed to have a length which is considerably less than one-quarter wavelength of the LO and RF frequencies.

31 Claims, 4 Drawing Sheets

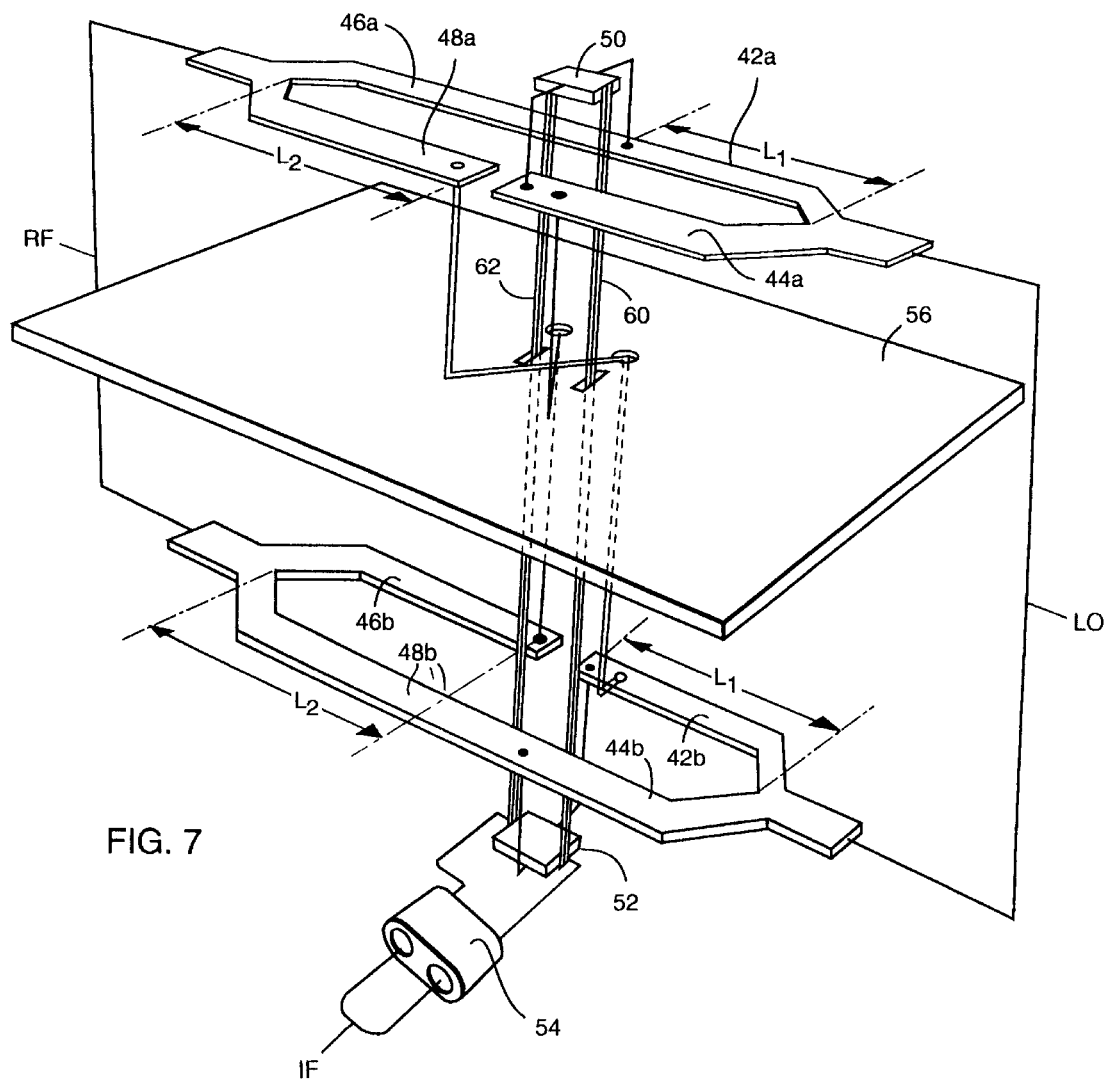
FIG. 7
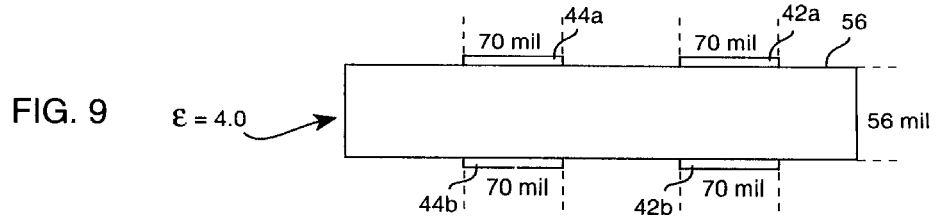
FIG. 9    ε = 4.0

HIGH DYNAMIC RANGE MIXER HAVING LOW CONVERSION LOSS, LOW LOCAL OSCILLATOR INPUT POWER, AND HIGH DYNAMIC RANGE AND A METHOD FOR DESIGNING THE SAME

FIELD OF THE INVENTION

The present invention relates to mixers, and in particular, to a high performance mixer and a method of designing same.

BACKGROUND OF THE INVENTION

There are basically four types of mixer circuits: single-ended, single-balanced, double-balanced, and double-double-balanced. Each type has its own set of performance tradeoffs that must be considered to optimize system performance. The tradeoffs include (1) the degree to which signals at one mixer port are isolated from other mixer ports (interport isolation), (2) suppression of intermodulation products that occur as a result of the mixing process which is directly related to the dynamic range of the mixer (as described below), (3) how much power is consumed in the mixing process (i.e., conversion loss); and (4) input power required to drive the mixer.

A single-ended mixer 10 which uses a single diode 12 is shown in FIG. 1. Local oscillator (LO), radio frequency (RF), and intermediate frequency (IF) ports are separated by bandpass filters (BPF) 14 and 16 and low-pass filter (LPF) 18 to provide interport isolation. For high isolation, the bandwidths of the filters should not overlap. Such isolation in a single-ended mixer forces the local oscillator and RF currents into the diode 12 and outputs an IF current from the IF port. The diode current i is determined in accordance with the following equation $$i = Isat^*[e^{\alpha v} - 1] \quad (1)$$

which can be expanded to $$i = Isat^*[\alpha v + (\alpha v)^2/2! + (\alpha v)^3/3! + \ldots + (\alpha v)^n/n! + \ldots 1] \quad (2)$$

where Isat is the reverse saturation current of the diode 12, $\alpha$ is a constant, and v is the voltage across the diode 12, and i is the current through the diode. If the BPF filters in FIG. 1 have high impedance (except for their passbands), the voltage generated at the diode 12 resulting from currents at other frequencies outside the passband are negligible. Accordingly, the diode terminal voltage is written as $$v = V_r^* \cos(2\pi f_r t + \theta_r) + V_1^* \cos(2\pi f_1 t + \theta_1) + V_i^* \cos(2\pi f_i t + \theta_i) \quad (3)$$

where the subscripts r, 1 and i refer to the input signal RF, LO and IF outputs, respectively.

A down-converting mixer is represented as $f_{IF} = f_{RF} - f_{LO}$, whereas $f_{IF} = f_{RF} + f_{LO}$ represents an up-converting mixer. Because the diode is a nonlinear element, IF products are generated by the current mixing of the LO and RF inputs at the diode 12. The possible IF products are defined as $$f_{IF} = \pm m \cdot f_{RF} \pm n \cdot f_{LO} \text{ where } m, n = 0, 1, 2, 3, \ldots \quad (4)$$

Single-ended mixers operate with very low LO input power because only the single diode 12 must be forward-biased. This is beneficial in systems having low power requirements such as battery-operated radios. Unfortunately, low LO input power typically results in low mixer dynamic range because the RF input is usually limited to 5 to 10 dB below the LO input power level. In order to increase the dynamic range, more diodes have to be used. Increasing the number of diodes also increases the drive power requirements.

A single-balanced mixer 20 is composed of two single-ended mixers as shown in FIG. 2. A LO port balun 22 balances the RF drive current to the diodes D1 and D2 and interfaces them with the unbalanced LO input. In accordance with conventional mixer design principles, the length of the LO port balun 22 is one-quarter wavelength of the LO signal. The most important characteristic about a balun is its ability to maintain constant phase angles with respect to ground: ±90° at point B, ±90° at point D, and 0° at point C (if it has a center tap). When these phase angles are maintained, the balun 22 is well balanced providing diode currents $i_1$ and $i_2$ which differ in phase by 180° and therefore cancel if they have the same amplitude.

Thus, balanced mixers use baluns and diodes. A balun is essentially a transmission line used to balance the drive currents to the diodes and interface the diodes with the LO and RF inputs which are part of an unbalanced system. The balun also matches the system and diode impedances and provides interport isolation. Currents in the two balanced leads of a balun are 180° apart in phase and ±90° out of phase with respect to ground. To function as impedance matching and balancing devices to the LO and RF input terminals, balun transformers are traditionally designed as quarter wavelength long transmission lines. As a result, a signal at a given frequency (corresponding to the quarter wavelength) flowing through the quarter wavelength transmission line is shifted in phase by 90°.

There are two different kinds of balun transformers. The first kind is a center-tapped transformer with a ferrite core wound with bi-, tri- or quadrifilar wires. The second kind uses a suspended transmission stripline or more commonly a transmission line etched on a laminated printed circuit board. Although the first kind of balun transformer has adequate balance and impedance ratios, the frequency dependence of the core permeability limits the bandwidth over which the balun operates, i.e., the "electrical lengths" of the windings change as frequency changes, causing a corresponding change in phase. As a result, above 400 MHz, the first type of balun does not perform consistently which, coupled with the parasitic effect of the windings, limits its effectiveness unless the balun windings are individually adjusted for each mixer—a costly and time-consuming task.

The second kind of balun transformer employing strip lines is used extensively at frequencies in the MHz range in applications such as portable/mobile radio communications using 400–500 MHz (UHF) and 800–900 MHz frequencies. These kinds of frequencies correspond to quarter wavelengths of 17 and 9 cm, respectively, and wavelengths are relatively long for some applications. For example, these stripline lengths are simply too long to be used in current portable/mobile radio communications where small size is an important design parameter.

In theory, balancing of the balun and matching of the diodes in single-balanced mixers provides LO-to-IF and LO-to-RF isolation. Diodes are matched if their current vs. voltage (i - v) curves and parasitic reactances match. Matched diodes form a voltage divider causing a "virtual ground" to appear at the junction of diodes D1 and D2 in FIG. 2 at node 24. Such a virtual ground node has a 0° phase angle with respect to ground, and as a result, the LO voltage does not appear at the RF and IF ports, i.e., the LO port is isolated from the RF and IF ports. This type of isolation is broadband because balun balance and diode match are less susceptible to frequency change than are filters. Of course in practice, baluns are never perfectly balanced, and diodes are never perfectly matched. Consequently, a finite amount of LO power appears at the RF and IF ports. In addition to LO-to-IF and LO-to-RF isolation, single-balanced mixers provide RF-to-LO isolation because the RF currents from diodes D1 and D2 cancel each other in the LO balun 22. RF-to-IF isolation is achieved by the IF port low-pass filter to prevent RF current from appearing at the IF port.

In addition to having greater LO-to-RF and LO-to-IF isolation than single-ended mixers, single-balanced mixers also have better intermodulation (IM) suppression. Half of the possible intermodulation products from the IF-port are suppressed because even harmonics of the RF signal are cancelled at the virtual ground node 24 between the two diodes D1 and D2 if the circuit is balanced and the diodes are matched.

While the additional diodes in single-balanced mixers improve interport isolation and intermodulation suppression, those added diodes require more LO power, and as a result, provide greater dynamic range at the IF output port. A diode can be modeled as a switch that is either open or closed: a closed switch allows current flow in both directions. In FIGS. 3(a) and 3(b), the LO currents $i_2$ and $i_1$ forward bias their respective diodes D2 and D1 "on" or "close the switch." Therefore, RF current $i_{RF}$ in FIGS. 3(a) and 3(b) may flow from cathode to anode in diode D2 if the RF current $i_{RF}$ through diode D2 is much smaller than the LO current $i_{LO}$ forward biasing the diode D2 "on," i.e., diode D2 appears to the RF current as a closed switch. In this scenario, the small signal RF current $i_{RF}$ flowing in diode D2 cancels a small part of the large-signal LO current $i_{LO}$ shifting the average operating point of diode D2 to a lower voltage as illustrated in FIG. 3(a). In an alternate scenario, the RF current $i_{RF}$ flowing in diode D1 adds to the LO current $i_{LO}$ causing the average operating point of diode D1 to have a higher voltage as illustrated in FIG. 30(b).

Conversion losses (and therefore lower efficiencies) are introduced by the frequency mixing process, diode turn-on resistances and transmission line losses. In this mixer context, conversion loss is the difference (typically expressed in dBs) between the output IF power and the input RF power. Providing sufficient LO power level to the diodes can minimize the power loss in the diodes. For a given LO power level, the RF input power level has to be below a certain range in order to have reasonable mixer conversion loss and dynamic range. To increase the dynamic range of the mixer, the third-order intercept point of the mixer needs to be increased. One way of increasing the dynamic range of the mixer is to increase the number of the diodes in each diode path. However, more diodes demand more LO power, and the conversion loss is increased because of the increased turn-on resistance in the diode path.

Overall, if the system requires high LO-to-RF and LO-to-IF isolation over a broad bandwidth, RF and IF interport isolation, and suppression of intermodulation products with even harmonics of RF, a single-balanced mixer is a better choice than a single-ended mixer.

Double-balanced mixers are composed of two single-balanced mixers. As shown in FIG. 4, combining two single-balanced mixers results in a "ring" type, double-balanced mixer 30. Double-balanced mixers use two baluns 32 and 34. LO-to-RF isolation and LO-to-IF isolation in double-balanced mixers are achieved in the same way as in single-balanced mixers except that the RF-port balun 34 causes the LO-generated voltage appearing at the RF-port to equal the difference between the small voltages appearing at node junctions $J_1$ and $J_2$. Ideally, these small, LO-generated voltages are nullified at virtual grounds. However, mismatches in the two baluns 32 and 34 and the diodes D1–D4 create a LO-generated voltage at the IF-port which is the sum of the small voltages at nodes $J_1$ and $J_2$. It is interesting to note that if the IF-port were placed at the current return of the LO-port balun instead of at the RF-port balun as shown in FIG. 4, LO-to-IF isolation would degrade because (1) diode matching is not used to help isolate the LO-port and IF-port, (2) the LO port is not balanced due to the loss of its ground return, and (3) the IF-port is more susceptible to receiving LO power radiated from the LO-port if the two are physically close together.

RF-to-IF isolation in double-balanced mixers is provided by the balance of the RF-port balun 34. In theory, the IF-port is a virtual ground with respect to the RF-port input voltage. However, this voltage nulling effect depends heavily on the balance of the RF-port balun.

Compared to single-balanced mixers, double-balanced mixers theoretically generate only one quarter of the possible IM products, i.e., those IM products having odd $f_{RF}$ and odd $f_{LO}$ harmonics. The remaining IM products are suppressed as a function of balun balance and diode match. But this increased IM suppression comes at a cost. Compared to single balanced mixers, double balanced mixers typically require 3 dB more LO input power than single-balanced mixers because double-balanced mixers use twice as many diodes. Hence, a double-balanced mixer provides greater IM suppression and dynamic range but at the cost of increased LO input power, conversion loss, and battery drain.

In portable mobile radio communications applications, two (or more) different RF input signals may enter a radio's mixer and mix with the local oscillator signal and produce unwanted, in-band intermodulation (IM) products. Because the Schottky diodes used in mixers are nonlinear elements, diode mixers invariably have high levels of multi-tone IM products. When two closely spaced RF inputs corresponding to two closely spaced RF frequencies $f_{RF1}$ and $f_{RF2}$ are mixed, they generate other signals at IM frequencies in accordance with:

$$f_{IM} = \pm q f_{RF1} \pm p f_{RF2} \pm s f_{LO} \qquad (5)$$

where q, p and s are positive integers. The most troublesome of these are third-order (q+p=3), two-tone products—$2f_{RF1}-f_{RF2}$ and $2f_{RF2}-f_{RF1}$—which the mixer downconverts in frequency and presents at the IF port along with the desired IF output signal.

These third-order, two-tone mixer output products are particularly troublesome in a radio receiver converting received signals from RF to IF because they are produced by signals which are allowed by design to pass unfiltered from the antenna to the mixer. Two signals separated by certain frequencies from the desired RF frequency can produce a third signal which has the same frequency as the desired signal. For example, if $f_{RF}$ is the desired signal, then two signals having frequencies $f_{RF}+x$ and $f_{RF}+2x$ will add algebraically to produce an on-channel signal, i.e., $2(f_{RF}+x)-(f_{RF}+2x)=f_{RF}$. Similarly two signals having frequencies $f_{RF}-x$ and $f_{RF}-2x$ will produce a signal as follows: $2(f_{RF}-x)-(f_{RF}-2x)=f_{RF}$. The variable x is any multiple of the RF channel spacing. From this example, it can be seen that there are many undesired signals which can combine in this manner to produce undesired on-channel (and therefore interfering) signals.

One way of reducing these third-order, two-tone intermodulation products is to increase the LO input power level so that the diodes operate briefly in the highly non-linear transition region of the diode i-v characteristic thereby increasing the average mixer impedance as explained above. Alternately, the forward voltage drop in each diode leg could be increased by placing additional diodes or resistive elements in each leg of the mixer ring thereby increasing the LO drive level. Adopting either of these methods to suppress IM distortion has its drawbacks. Increasing LO drive using the first method increases the total power consumption of the radio receiver (and battery drain) and also increases radio cost. It further degrades the spurious performance of the receiver and makes it more difficult to meet the limits imposed by radio communications regulating authorities. For example, the leakage of the LO and its harmonics through the antenna increase as the LO power is increased. Increasing the number of diodes in the mixers in the second method increases the noise figure of the mixer and conversion loss as mentioned above because the turn-on resistance of each diode path is increased as the number of diodes is increased.

Because of the importance of IM suppression in portable/mobile radios, the third-order intercept point, which is often used to predict second and third-order distortion suppression in nonlinear amplifiers, is increasingly being applied as a specification for double-balanced mixers. The third-order intercept point is the intersection of the desired mixer linear output and the third-order IM output as illustrated for example in FIG. 5. The third-order, two-tone output in FIG. 5 has a 3:1 slope on an absolute log—log scale compared to the desired linear output which has a 1:1 slope, i.e., a relative slope of 2:1. Hence, for each dB the input is reduced, the third-order two-tone output is reduced by 2 dB. To achieve a high dynamic range mixer, the third order intercept point should be as large as practically possible. The third-order intercept point is a function of the nonlinearity of the mixer and, unlike IM products, is not linearly related to the input RF levels. The relationship between the third-order intercept point $IP3_i$ and the IM products at the mixer IF output can be expressed as follows:

$$IP3 = P_{in} + \Delta(IM)_{out}/2 \qquad (6)$$

where $\Delta(IM)_{out}$ is the difference between the power level of the desired linear output signal and the power level of the third-order products.

In view of the tradeoffs described above, it is difficult to design a mixer with a high dynamic range at a relatively low LO power and low conversion loss. As a specific example, for an LO input drive level on the order of 17 dBm, it is very difficult to design any type of mixer that has a third-order intercept point on the order of 28–30 dBm. The third-order intercept point (IP3) of a mixer determines its dynamic range. But designing a mixer with high IP3 performance usually requires high local oscillator (LO) power which increases the total power consumption, and more diodes in each branch of the diode ring increases conversion loss. These fundamental problems with high dynamic-range mixers have yet to be satisfactorily solved.

SUMMARY OF THE INVENTION

It is an object of the present invention to provide a mixer with high dynamic range /IP3 performance at a relatively low local oscillator power and low conversion loss.

It is an object of the present invention to provide a mixer having consistent high performance parameters at low local oscillator drive level and low conversion loss over a wide frequency range which does not require manual adjustment.

It is a further object of the present invention to provide such a high performance mixer using microstrip technology which is easy to manufacture, low in cost, and can be mounted on the same printed circuit board along with other radio transceiving circuitry.

A microstrip mixer in accordance with the present invention provides high dynamic range/high third order intercept point (IP3) and low conversion loss at a low local oscillator input power. Unlike conventional microstrip mixers, the mixer according to the present invention uses a different topology based upon predetermined, specific dimensions of the microstrips and predetermined relationships between those dimensions. One significant feature of this mixer topology is that the lengths of the microstrips are considerably shorter than a quarter wavelength of the RF and local oscillator frequencies. The dimensions of the mixer including length and width of the microstrips, the substrate thickness, and the substrate dielectric constant are specified and controlled within a certain range. Two diode rings are employed to provide a high dynamic range, and carefully chosen microstrip and substrate dimensions permit such an increase in dynamic range without an increase in conversion loss, an increase in local oscillator input power, or decreased interport isolation. An example of a stripline mixer designed and manufactured in accordance with the present invention for operation in the UHF through RF range has a third order intercept point on the order of 28 dBm requiring only a local oscillator drive level of about 17 dBm with a very acceptable conversion loss on the order of 5 to 6 dB.

The microstrip mixer includes first and second radio frequency (RF) baluns and first and second local oscillator (LO) baluns formed on a dielectric substrate and connected to two diode rings. An LO input port receives a local oscillator signal, and an RF input port receives a radio frequency input signal in a range of 400–1200 MHz. An intermediate frequency port is connected to the diode rings. The length of the RF baluns is less than one quarter wavelength of an RF frequency of the mixer, and a length of the LO baluns is less than one quarter wavelength of an LO frequency of the mixer. As described above, the lengths of the RF and LO baluns are carefully selected to provide high dynamic range and low conversion loss. More specifically, the length of the LO balun is less than the length of the RF balun and the ratio between the two is on the order of 0.8. The LO balun length is in the range of 0.74 to 0.84 inches, and the RF balun length is the range of 0.96 to 1.04 inches. The dielectric substrate has a dielectric constant in the range of 3.5–4.5, and the width of the baluns is in the range of 0.06–0.08 inches while a thickness of the dielectric substrate is in the range of 0.046 to 0.066 inches. A ratio of a width of the baluns to a thickness of the dielectric substrate is in the range of 0.9–1.75.

BRIEF DESCRIPTION OF THE DRAWINGS

These and other objects and advantages of the present invention will become more apparent by referring to the following detailed description and drawings, in which:

FIG. 7 is an exploded perspective view of the strip line double-double balanced mixer in accordance with the present invention;

FIG. 9 is a cross-sectional diagram of the double-double balanced mixer shown in FIG. 7;

DETAILED DESCRIPTION OF PREFERRED EMBODIMENTS

In the following description, for purposes of explanation and not limitation, specific details are set forth, such as particular circuits, components, interfaces, techniques, etc. in order to provide a thorough understanding of the present invention. However, it will be apparent to one skilled in the art that the present invention may be practiced in other embodiments that depart from these specific details. In other instances, detailed descriptions of well-known methods, devices, circuits, circuit components, etc. are omitted so as not to obscure the description of the present invention with unnecessary detail.

Figure 6:
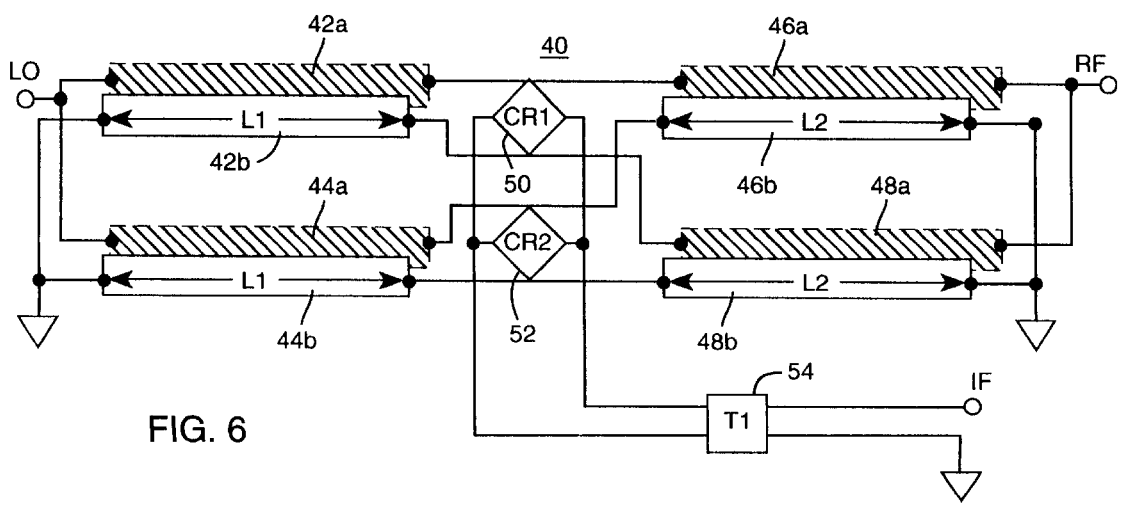
FIG. 6 is a diagram illustrating the double-double-balanced mixer in accordance with the present invention.

FIG. 6 is a diagram illustrating a double-double-balanced mixer in accordance with the present invention. The mixer includes a local oscillator (LO) port, a radio frequency (RF) port, and an intermediate frequency (IF) port. The local oscillator port is connected to first and second local oscillator baluns. The first LO balun includes a first microstrip 42a formed on the top of a dielectric substrate and a bottom microstrip 42b corresponding to the first balun is formed on the bottom side. Similarly, the second LO balun includes a top microstrip 44a and a bottom microstrip 44b. Each top and corresponding bottom balun microstrip has the same length L1 and is therefore "balanced." The RF input port is also connected to first and second RF baluns. The first RF balun includes a top microstrip 46a formed on the top of the dielectric substrate and a bottom microstrip 46b formed on the bottom side. The second RF balun includes a top microstrip 48a and a bottom microstrip 48b. All of the microstrips in the RF first and second baluns are the same length L2. In accordance with a specific design parameter of the present invention, balun length L1 is less than balun length L2.

Figure 1:
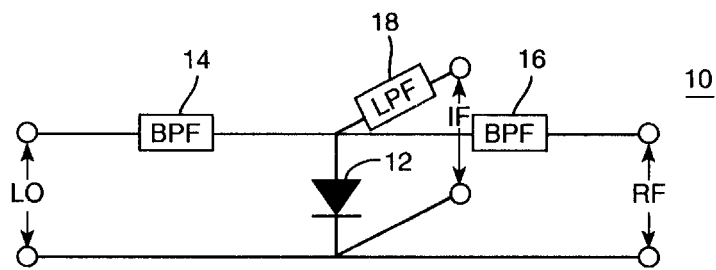
FIG. 1 is a schematic diagram of a single-ended mixer.
Figure 2:
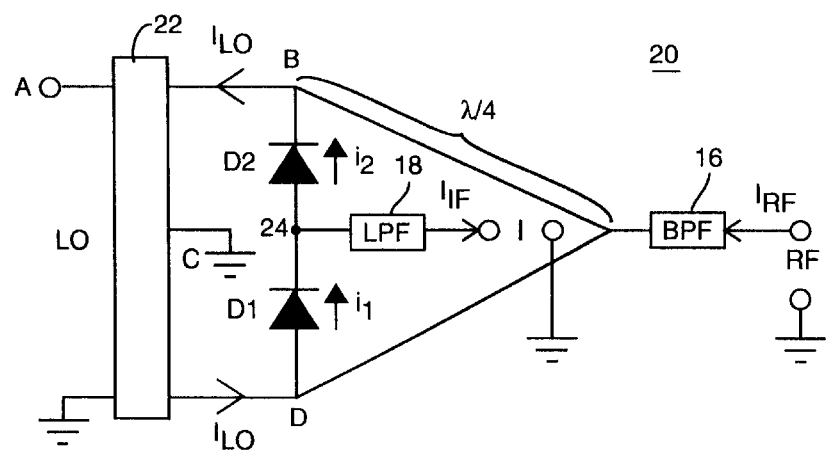
FIG. 2 is a schematic diagram of a single-balanced mixer.
Figure 3A:
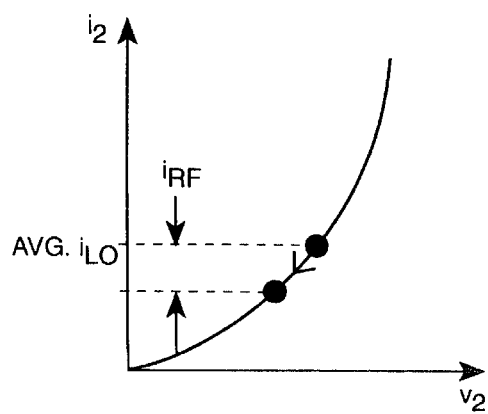
FIGS. 3(a) and 3(b) are current to voltage curves for the diodes shown in the single-balanced mixer of FIG. 2.
Figure 3B:
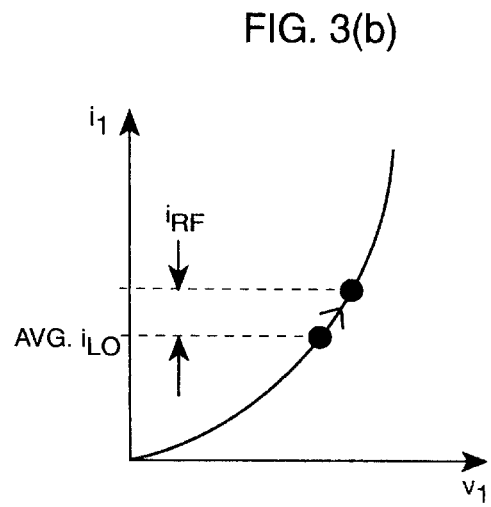
Figure 4:
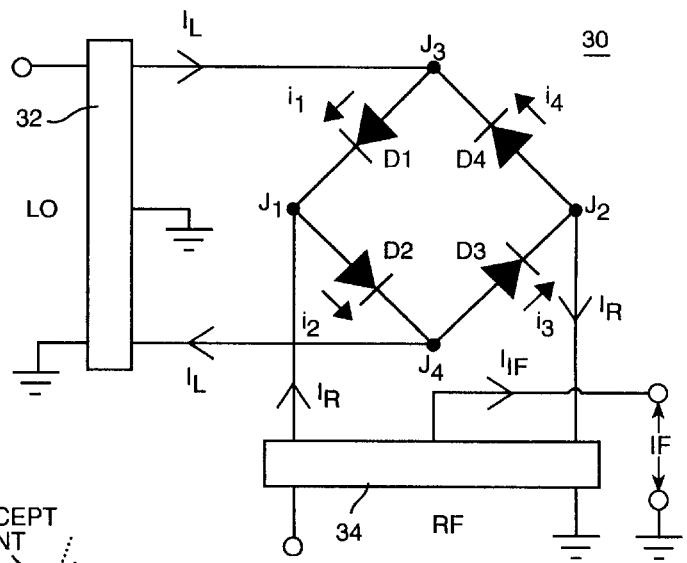
FIG. 4 is a schematic diagram of a double-balanced mixer.
Figure 5:
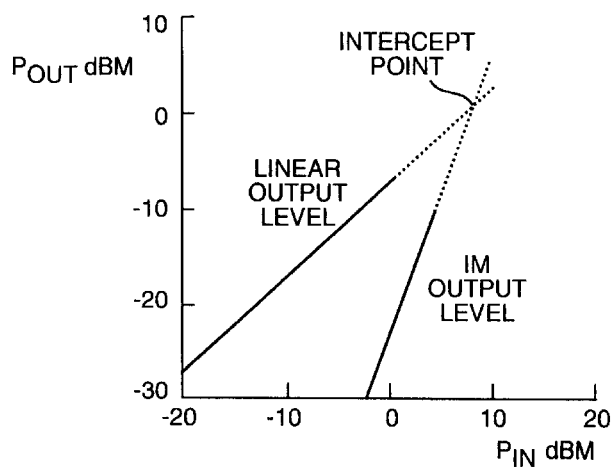
FIG. 5 is a graph plotting output power against input power for mixer linear output level and intermodulation output level intersecting at a third intercept point.

The first and second LO baluns and the first and second RF baluns are connected to a first diode ring 50 and a second diode ring 52 in the manner shown in FIG. 6. The term double-double-balanced comes from the use of two diode rings. Each diode ring 50 includes four diodes such as that shown in FIG. 4. The IF port terminations are connected at opposing nodes in the first and second diode rings 50 and 52 through a transformer 54.

An exploded perspective view of the stripline double-double-balanced mixer is shown in FIG. 7. The RF and LO input ports as well as the IF output port are indicated generally. The first top diode ring 50 is separated from the second bottom diode ring 52 by a dielectric substrate 56 which may be a printed circuit board (PCB). On the top portion of the dielectric substrate 56 are formed the top stripline conductors (46a and 48a) of the first and second RF baluns and the top stripline conductors (42a and 44a) of the first and second LO baluns. The bottom stripline conductors (46b and 48b) corresponding to the first and second RF baluns are formed on the bottom of the dielectric substrate 56 as are the bottom stripline conductors (42b and 44b) of the first and second local oscillator baluns.

The length L1 of the local oscillator baluns is measured from the single, unbalanced end (starting at the V-portion of the "Y"), which connects to the local oscillator port, to the balanced end connected by wire conductor to the diode ring 50. Microstrips 42a and 42b form a balun and microstrips 44a and 44b form another balun. The separation of the two baluns is sufficient to isolate them. The baluns need not be Y-shaped. In general, a balun is a device or circuit configuration which produces two signals, balanced with respect to ground, from a single signal which is unbalanced with respect to ground.

The first microstrip top conductors for both the RF and LO baluns (46a and 42a respectively) are physically connected as part of the same conductor or strip line. The second top microstrip lines 44a and 48a for the LO and RF baluns are separated by a suitable gap, e.g., on the order of 0.04 inches. As shown in both FIGS. 6 and 7, these second top baluns 44a and 48a are connected to corresponding but opposite second bottom side strip lines of the RF and LO baluns. Namely, the top RF microstrip 48a is connected to the bottom LO microstrip 42b, and the top LO microstrip 44a is connected to the bottom RF microstrip 46b. Both diode rings are directly connected by conductors 60 and 62.

Figure 8:
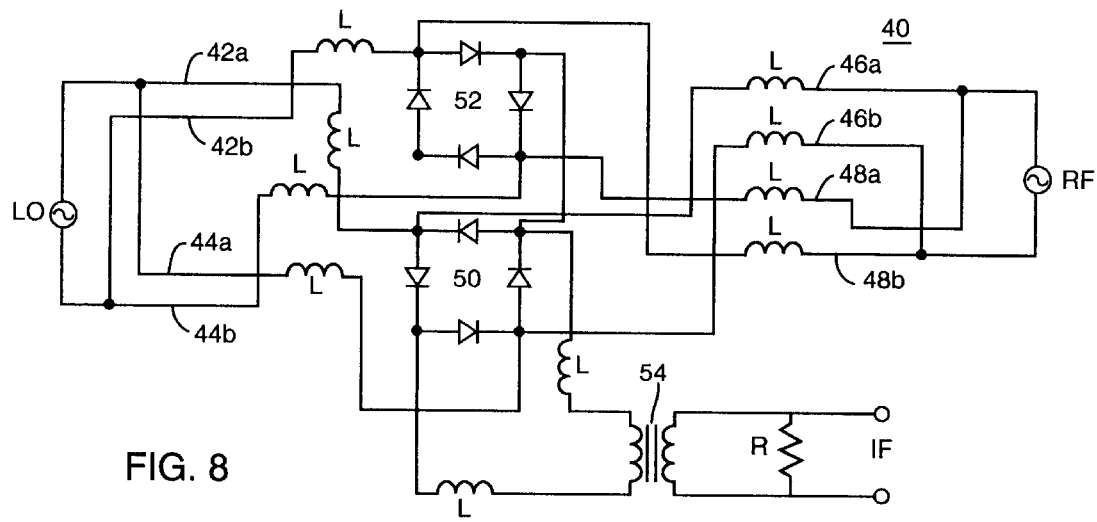
FIG. 8 is an electrical schematic diagram corresponding to the double-double balanced mixer illustrated in FIGS. 6 and 7.

FIG. 8 is an electrical schematic diagram corresponding to the double-double balanced mixer illustrated in FIGS. 6 and 7. This schematic is relatively self-explanatory, showing the four diodes in each of the diode rings 50 and 52. The local oscillator and radio frequency sources are connected to diode rings 50 and 52 through parallel transmission lines. Inductors L represent the inductance of the leads connected to the diode rings. The intermediate frequency output port is connected by way of transformer 54 to each of the diode rings 50 and 52 as shown.

FIG. 9 is a cross-sectional diagram of the double-double-balanced mixer shown in FIG. 7. The dielectric substrate may have a dielectric constant in the range of 3.5–4.5 and is indicated generally as 4.0. The dielectric substrate 56 has a specifically designed thickness on the order of 56 mil (56 mil being equivalent to 0.056 inches). The width of the balun conductors 42a, 42b, 44a, and 44b shown in this cross-section example is on the order of 70 mils or 0.07 inches. The thickness of the dielectric substrate 56 and the width of the balun conductors may vary by plus or minus 10 mils.

The thickness and width dimensions are selected in accordance with a previously determined design relationship. Specifically, the ratio between the width dimension to the thickness dimension is 70/56 or 1.25. Because of the range of widths and thickness indicated above, the ratio range is on the order of 0.9–1.75. These dimensions and ratio, like all of the mixer design specifications for designing the mixer in accordance with the present application, are predetermined so that the mixer provides a high dynamic range at low conversion loss and at low local oscillator input power. The balun's width dimension, dielectric substrate thickness dimension, and dielectric constant, in addition to the relationship between balun width and dielectric thickness, were optimized using circuit emulation software such as the Microwave Design System Software package available from Hewlett-Packard.

Other significant predetermined balun dimensions and relationships pertain to the balun lengths L1 and L2. Using the Microwave System Design Software, the inventors determined that optimal lengths of the LO and RF baluns could be less than one-quarter wavelength of the LO and RF frequencies, respectively. This discovery is contrary to conventional mixer theory which posits that the length of the balun must be one-quarter wavelength of its lowest operating frequency in order to provide satisfactory IP3 performance and satisfactory interport isolation. For example, at a frequency of 410 MHz, a microstrip balun formed on a printed circuit board substrate with a dielectric constant $\epsilon=4$ would be 3.6 inches long at a quarter wavelength. This length is simply too long to be practical for use in portable/mobile radios operating in the 410 MHz range.

Through careful design testing, the inventors of the present invention further discovered that by carefully selecting the dimensions of the microstrip mixer including balun lengths L1 and L2, thickness of the mixer PCB substrate, dielectric constant, and width of the microstrip lines, balun microstrip lengths L1 and L2 could be considerably less than one-quarter wavelength while still providing high dynamic-range performance, better-than-satisfactory interport isolation, low conversion-loss, and low local-oscillator input power. In fact, for frequencies in the range, 400 MHz-900 MHz, an example of the mixer parameters determined to provide high performance are as follows. The local oscillator baluns were set at the same length L1 of 0.8 inches or 800 mils while length L2 for the RF baluns was determined to be 1.0 inch or 1,000 mils. The optimal ratio of L1 to L2 is in the range of 0.7 and 0.9 and thus includes balun length values L1 and L2 other than 800 and 1000 mils. The width of the microstrip baluns was set at 70 mils. A suitable tolerance is set for balun lengths L1 and L2 and width on the order of +10 or −10 mils. The thickness of the mixer PCB substrate was set to 56 mils with the dielectric consent $\epsilon=4.0$.

Figure 10:
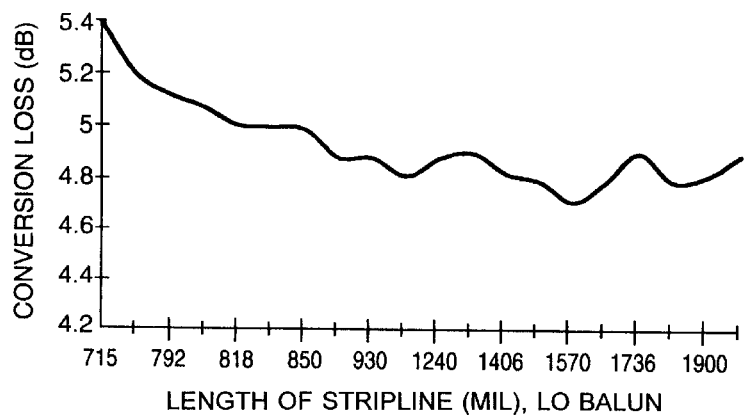
FIG. 10 is a graph plotting the conversion loss against length of strip line for the double-double balanced mixer in accordance with an example of the present invention.
Figure 11:
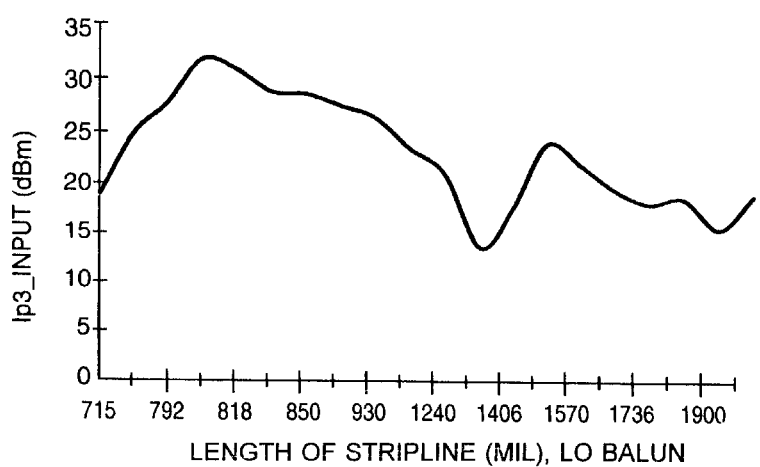
FIG. 11 is a graph of the third order input intercept plotted against length of the strip line of the double-double-balanced mixer in accordance with an example of the present invention.

Reference is made to the graphs shown in FIGS. 10 and 11. FIG. 10 plots for the mixer designed in accordance with the above example parameters the conversion loss in dB against the length of the LO balun stripline in mils. FIG. 11 plots for the mixer designed in accordance with the above example parameters the third order input intercept point IP3 in dBm against the length of the LO balun stripline in mils. These curves reveal a completely new and advantageous way of designing high-dynamic range mixers. In these Figures, an optimal stripline length for the LO baluns corresponds to an IP3 input peak near 800 mils (see FIG. 11). The corresponding conversion loss for this length of stripline is on the order of 5 dB which is entirely acceptable for the IP3 point at 32 dBm corresponding to a relatively high dynamic range (see FIG. 10). Similar graphs were generated using the HP Microwave Design System Software for the RF balun length which is how the dimension of L2 corresponding to 1,000 mils was determined.

This mixer configuration design example was chosen using careful testing and evaluation of several hundred different configurations using the HP Microwave Design System Software. The performance obtained by a double-double-balanced mixer using the example configuration shown in FIG. 7 over the UHF through 900 MHz range is shown below.

@UHF frequency range
RF input frequency=451.4 MHz
LO input frequency=430 MHz
IF output frequency=21.4 MHz
Third-order input intercept point=28.0 dBm
Conversion Loss=5.7 dB
LO input power=16 dBm
VSWR@RF port=1.9
VSWR@LO port=2.2
VSWR@IF port=1.6
  @800 MHz frequency range
RF input frequency=815.2 MHz
LO input frequency=745 MHz
IF output frequency=70.2 MHz
Third-order input intercept point=28.5 dBm
Conversion Loss=5.6 dB
LO input power=17 dBm
VSWR@RF port=2.0
VSWR@LO port=1.8
VSWR@IF port=1.4
  @900 MHz frequency range
RF input frequency=900.2 MHz
LO input frequency=830 MHz
IF output frequency=70.2 MHz
Third-order input intercept point=28.0 dBm
Conversion Loss=6.2 dB
LO input power=17 dBm
VSWR@RF port=2.3
VSWR@LO port=2.1
VSWR@IF port=1.9

These example results at 400, 800 and 900 MHz indicate that high dynamic range was achieved (meaning that there was high suppression of intermodulation products, in particular the third-order, two-tone products) as indicated by a third order intercept point greater than or equal to 28 dBm. Conversion loss was quite satisfactory being on par with other conventional mixers, which achieve a much lower third-order input intercept-point, in the range of about 5.5 dB–6.2 dB. Unlike conventional stripline mixers, the local oscillator input power was very low at 16 dBm. The example mixer designed in accordance with the present invention has a third-order intercept point 3-dB higher (twice as high) and a required LO input power 3-dB lower (half the amount) as commercially available mixers using wound baluns.

Thus, the present invention provides a new design approach that permits design of stripline mixers including RF and LO baluns formed on a dielectric substrate which produce an intermediate frequency output signal at an IF port by selecting dimensions of the baluns and substrate so that the mixer provides high dynamic-range and relatively low conversion loss at a relatively low oscillator input power. In this design approach, the lengths of the LO baluns and the RF baluns are determined based on a predetermined proportional relationship, and the width of the balun microstrips is selected to be within a predetermined range. The length of the RF baluns is less than one-quarter wavelength of the RF frequency, and the length of the LO baluns is less than one-quarter wavelength of the LO frequency of the mixer. A predetermined relationship is established between the LO balun length and the RF balun length such that the lengths of the LO baluns are less than the length of the RF baluns. A predetermined relationship is also established between a width of the baluns and a thickness of the printed circuit board substrate, with the width and thickness being selected in accordance with that predetermined relationship. Ultimately, the specific mixer dimensions are selected such that the third order input intercept point for the mixer operating in a frequency range of 400–900 MHz is in the range of 28–32 dBm at a conversion loss in the range of 4–6 dB at a local oscillator input power in the range of 16–20 dBm.

The present invention therefore provides an entirely different approach to stripline mixer design as well as a completely novel mixer topology. Since the balun striplines can be considerably less than one-quarter wavelength, the mixer topology in accordance with the present invention is well suited for applications where size is an important factor such as in portable/mobile radio communications. Moreover, the mixer topology in accordance with the present invention is easy and relatively inexpensive to manufacture especially when compared to wound baluns. The mixer can also be manufactured on the same printed circuit board on which other radio receiver circuitry is formed. Another advantage of the mixer topology in accordance with the present invention is that unlike wound baluns, there is no need to adjust the baluns of each mixer individually.

While the invention has been described in connection with what is presently considered to be the most practical preferred embodiment, it is to be understood that the invention is not to be limited to the disclosed embodiment, but on the contrary, is intended to cover various modifications and equivalent arrangements included within the spirit and scope of the appended claims.

What is claimed is:

1. A microstrip mixer, comprising:
   a dielectric substrate;
   a local oscillator input port receiving a local oscillator signal in a range of 400–900 MHz;
   a radio frequency input port receiving a radio frequency input signal in a range of 400–900 MHz;
   an intermediate frequency output port;
   first and second diode rings;
   a transformer connected at one side to the diode rings and at another side to the intermediate frequency output port;
   first and second microstrip transmission line baluns having a first length less than a quarter wavelength of the local oscillator frequency and being formed on the dielectric substrate each connected at one end to the local oscillator input port and at an opposite end to one of the diode rings;
   third and fourth microstrip transmission line baluns having a second length less than a quarter wavelength of the radio frequency and being formed on the dielectric substrate each connected at one end to the radio frequency input port and at an opposite end to one of the diode rings,
   wherein the first and second baluns are connected to the third and fourth baluns and the first length is less than the second length, and
   wherein the first length being less than a quarter wavelength of the local oscillator frequency effects a signal phase change in the first and second microstrip transmission line baluns, and the second length being less than a quarter wavelength of the radio frequency oscillator frequency effects a signal phase change in the third and fourth microstrip transmission line baluns.

2. The mixer in claim 1, wherein the dielectric substrate has a dielectric constant in the range of 3.5 to 4.5.

3. The mixer in claim 1, wherein a width of the baluns is in the range of 0.06 to 0.08 inches and a thickness of the dielectric substrate is in the range of 0.046 to 0.066 inches.

4. The mixer in claim 1, wherein a ratio of a width of the baluns to a thickness of the dielectric substrate is in the range of 0.9 to 1.75.

5. The mixer in claim 1, wherein a ratio of the first length to the second length is in a range of 0.7 and 0.9.

6. The mixer in claim 1, wherein a ratio of the first length to the second length is substantially on the order of 0.8.

7. The mixer in claim 1, wherein the first length is substantially in the range of 0.74 to 0.84 inches and the second length is substantially in the range of 0.96 and 1.04 inches.

8. The mixer in claim 1, wherein a third order input intercept point for the stripline mixer is in the range of 28–32 dBm at a conversion loss in the range of 4 to 6 dB at a local oscillator input power in the range of 16–20 dBm.

9. The mixer in claim 1, wherein the first and second baluns include parallel conductive strips at one end that merge into a single strip at an opposite end.

10. A balanced mixer operable in the UHF through the 900 MHz frequency range, comprising:
    first and second radio frequency (RF) transmission line baluns and first and second local oscillator (LO) transmission line baluns formed on a dielectric substrate and connected to one or more diode rings;
    an intermediate frequency (IF) port connected to one or more diode rings;
    wherein a length of the RF transmission line baluns is considerably less than one-quarter wavelength of an RF frequency of the mixer and a length of the LO transmission line baluns is considerably less than one-quarter wavelength of an LO frequency of the mixer, the lengths of the RF and LO transmission line baluns being selected to provide high dynamic range and low conversion loss.

11. The mixer in claim 10, wherein the high dynamic range as measured by a third order intercept point is around 28 dBm or more and the low conversion loss is around 5–6 dB.

12. The mixer in claim 10, wherein the LO transmission line baluns are shorter in length than the RF transmission line baluns.

13. The mixer in accordance with claim 12, wherein at an RF input frequency of about 450 MHz and a local oscillator input frequency of about 430 MHz to produce an intermediate output frequency of about 20 MHz, a third order input intercept point is on the order of 28 dBm with a conversion loss on the order of 5.5–6.0 dB at a local oscillator input power on the order of 16 dBm.

14. The mixer in accordance with claim 12, wherein at an RF input frequency of about 815 MHz and a local oscillator input frequency of about 745 MHz to produce an intermediate output frequency of about 70 MHz, a third-order input intercept point is on the order of 28–29 dBm with a conversion loss on the order of 5.5–6.0 dB.

15. The mixer in accordance with claim 12, wherein at the ultrahigh frequency range at an RF input frequency of about 900 MHz and a local oscillator input frequency of about 830 MHz to produce an intermediate output frequency of about 70 MHz, a third order input intercept point is on the order of 28 dBm with a conversion loss on the order of 6.2 dB.

16. The mixer in claim 10, wherein a length of the local oscillator balun is about 0.8 inches and a length of the RF transmission line balun is about 1.0 inches and a width of the LO and RF transmission line baluns is about 0.07 inches.

17. The mixer in claim 10, wherein the dielectric substrate has a dielectric constant in the range of 3.5 to 4.5.

18. The mixer in claim 10, wherein a width of the baluns is in the range of 0.06 to 0.08 inches and a thickness of the dielectric substrate is in the range of 0.046 to 0.066 inches.

19. The mixer in claim 10, further comprising first and second diode rings.

20. A method for designing a stripline mixer including radio frequency (RF) and local oscillator (LO) transmission line baluns formed on a dielectric substrate having RF and LO input ports and an intermediate frequency (IF) output port by selecting dimensions of the transmission line baluns to provide a high third order intercept point on the order of 28–32 dBm at a low conversion loss on the order of 4–6 dB and a low local oscillator input power on the order of 16–20 dBm.

21. The method of claim 20, further comprising the steps of selecting the lengths of the LO transmission line baluns and the length of the RF transmission line baluns based on a predetermined proportion, and selecting a width of the transmission line balun strips within a predetermined range.

22. The method of claim 20, further comprising the step of selecting a length of the RF transmission line baluns less than one-quarter wavelength of an RF frequency of the mixer and a length of the LO transmission line baluns less then one-quarter wavelength of an LO frequency of the mixer.

23. The method of claim 20, wherein the dimensions include a length and width of the RF and LO transmission line baluns and a thickness and dielectric constant of the substrate.

24. The method of claim 23, wherein the predetermined relationship is a ratio of the first length to the second length in a range of 0.7 to 0.9.

25. The method of claim 24, wherein for local oscillator and radio frequencies in the UHF through 900 MHz range, the first length is substantially in the range of 0.74 to 0.84 inches and the second length is substantially in the range of 0.96 and 1.04 inches.

26. The method of claim 20, further comprising the steps of establishing a predetermined relationship between the LO transmission line balun length and the RF transmission line balun length wherein the lengths of the LO transmission line baluns are less than the length of the RF transmission line baluns, and selecting the lengths of the LO and RF transmission line baluns in accordance with a predetermined relationship.

27. The method of claim 20, further comprising the steps of establishing a predetermined relationship between a width of the transmission line baluns and a thickness of the substrate, and selecting the width and thickness in accordance with the predetermined relationship.

28. The method of claim 20, wherein the dielectric substrate has a dielectric constant in the range of 3.5 to 4.5.

29. The method in claim 20, wherein a width of the transmission line baluns is in the range of 0.06 to 0.08 inches and a thickness of the dielectric substrate is in the range of 0.046 to 0.066 inches.

30. The method in claim 20, wherein a ratio of a width of the transmission line baluns to a thickness of the dielectric substrate is in the range of 0.9 to 1.75.

31. A mixer designed in accordance with the method of claim 20 wherein the mixer is designed operate in a local oscillator and radio frequency range of 400–900 MHz.

* * * * *